United States Patent
Jeon et al.

(10) Patent No.: US 8,684,581 B2
(45) Date of Patent: Apr. 1, 2014

(54) LIGHT-EMITTING DIODE PACKAGE, LIGHT SOURCE MODULE HAVING THE SAME AND BACKLIGHT ASSEMBLY HAVING THE SAME

(75) Inventors: Myoung-Ha Jeon, Asan-si (KR); Yeun-Mo Yeon, Asan-si (KR); Hyun-Jung Lee, Seoul (KR)

(73) Assignee: Samsung Display Co., Ltd., Suwon-Si, Gyeonggi-Do (KR)

( * ) Notice: Subject to any disclaimer, the term of this patent is extended or adjusted under 35 U.S.C. 154(b) by 225 days.

(21) Appl. No.: 13/181,540

(22) Filed: Jul. 13, 2011

(65) Prior Publication Data
US 2012/0163026 A1 Jun. 28, 2012

(30) Foreign Application Priority Data
Dec. 22, 2010 (KR) .................. 10-2010-0132101

(51) Int. Cl.
*F21V 8/00* (2006.01)
*F21V 21/00* (2006.01)
*F21V 15/01* (2006.01)

(52) U.S. Cl.
USPC ............... 362/612; 362/368; 362/249.02

(58) Field of Classification Search
None
See application file for complete search history.

(56) References Cited

U.S. PATENT DOCUMENTS

| 5,291,375 A * | 3/1994 | Mukai ......................... 361/760 |
| 8,153,903 B2 * | 4/2012 | Kanouda et al. .............. 174/255 |
| 2011/0026232 A1 * | 2/2011 | Lin et al. ....................... 361/760 |
| 2012/0063120 A1 * | 3/2012 | Park et al. ..................... 362/97.1 |

FOREIGN PATENT DOCUMENTS

| JP | 2007-293084 | 8/2007 |
| JP | 2008-294181 | 12/2008 |
| JP | 2009-206422 | 10/2009 |

* cited by examiner

*Primary Examiner* — Ashok Patel
(74) *Attorney, Agent, or Firm* — F. Chau & Associates, LLC

(57) ABSTRACT

A light-emitting diode ("LED") package includes a light-emitting chip, a case, first and second lead frames and a dummy lead frame. The light-emitting chip generates light. The case includes a bottom portion and a plurality of sidewalls, wherein the light-emitting chip is positioned in the case. The first and second lead frames are spaced apart from each other and are electrically connected to the light-emitting chip. The dummy lead frame is spaced apart from the light-emitting chip and the first and second lead frames, and is electrically isolated from the light-emitting chip and the first and second lead frames. The dummy lead frame is used as a wiring for connecting the LED package to another LED package, so that the number of signal wirings or a length of a signal wiring may be decreased, and a manufacturing cost of the LED package may be reduced.

15 Claims, 6 Drawing Sheets

US 8,684,581 B2

LIGHT-EMITTING DIODE PACKAGE, LIGHT SOURCE MODULE HAVING THE SAME AND BACKLIGHT ASSEMBLY HAVING THE SAME

PRIORITY STATEMENT

This application claims priority under 35 U.S.C. §119 to Korean Patent Application No. 2010-132101, filed on Dec. 22, 2010 in the Korean Intellectual Property Office (KIPO), the contents of which are herein incorporated by reference in their entirety.

BACKGROUND OF THE INVENTION

1. Technical Field

Example embodiments of the present invention relate to a light-emitting diode ("LED") package, a light source module having the LED package, and a backlight assembly having the light source module. More particularly, example embodiments of the present invention relate to an LED package used as a light source of a display device, a light source module having the LED package, and a backlight assembly having the light source module.

2. Discussion of the Related Art

A liquid crystal display ("LCD") device displays an image using a liquid crystal that has optical characteristics such as anisotropic refractivity and electrical characteristics such as an anisotropic dielectric constant. LCD devices are thinner, require a lower driving voltage, consume less power, etc., compared to other display devices such as cathode ray tube ("CRT") devices and plasma display panel ("PDP") devices. LCD devices are used in laptop computers, monitors, television receiver sets, mobile phones, etc. LCD devices display an image using optical and electrical properties of liquid crystal molecules, such as an anisotropic refractive index and an anisotropic dielectric constant. LCD devices include an LCD panel displaying an image using an optical transmittance of liquid crystal molecules and may include a backlight assembly disposed below the LCD panel to provide light to the LCD panel.

The backlight assembly includes a light source generating light required to display an image on the LCD panel. The backlight assembly may employ a cathode fluorescent lamp ("CCFL"), a flat fluorescent lamp ("FFL"), or a light-emitting diode ("LED") as the light source. When compared with the other light sources, LEDs have high light-emitting efficiency, a long lifetime, low power consumption, eco-friendly characteristics, etc., so that LEDs have been employed in various devices.

When the LED is employed as a light source of a backlight assembly, the LED may be manufactured as a package type LED in which a light-emitting chip is mounted on an inner portion of a case, and is electrically connected to a printed circuit board ("PCB") through a lead frame that is electrically connected to the light-emitting chip. LED packages are manufactured as top view and side view types depending on a usage thereof. In the top view type LED, light generated from the light-emitting chip is emitted toward an upper portion of the LED package. In the side view type LED, light generated from the light-emitting chip is emitted toward a side surface of the LED package.

The top view type LED may have a higher luminance and longer life than the side view type LED. However, when a backlight assembly employs the top view type LED, the PCB is received at a side wall of a receiving container so that a width of the PCB is limited. The width of the PCB is further limited in order to reduce the thickness of the LCD device. Moreover, the number of LEDs may be increased to increase the luminance of the LCD device, and thus the number of wirings and layers of the PCB are increased. Therefore, when the PCB is configured in multi-layers, manufacturing costs of the backlight assembly are increased.

SUMMARY OF THE INVENTION

Example embodiments of the present invention provide a light-emitting diode ("LED") package capable of reducing a manufacturing cost thereof, a light source module having the LED package, and a backlight assembly having the light source module.

According to one aspect of the present invention, an LED package includes a light-emitting chip, a case, first and second lead frames and a dummy lead frame. The light-emitting chip generates light. The case includes a bottom portion and a plurality of sidewalls, wherein the light-emitting chip is positioned in the case. The first and second lead frames are spaced apart from each other and electrically connected to the light-emitting chip. The dummy lead frame is spaced apart from the light-emitting chip and the first and second lead frames, and is electrically isolated from the light-emitting chip and the first and second lead frames.

In an example embodiment, the dummy lead frame may include a dummy wiring part and a dummy terminal part. The dummy wiring part may be disposed in an inner portion of the case. The dummy terminal part may include a first end disposed in an inner portion of the case and electrically connected to the dummy wiring part and a second end disposed at an external portion of the case for connection to a printed circuit board.

In an example embodiment, the dummy wiring part may make direct contact with the dummy terminal part.

In an example embodiment, the LED package may further include a dummy pad part disposed on the bottom portion of the case and electrically connected to the dummy wiring part. An open portion exposing the dummy pad part may be formed through the bottom portion of the case.

In an example embodiment, the dummy terminal part may include a first dummy terminal part and a second dummy terminal part. The first dummy terminal part may extend from the dummy wiring part along a first direction to be disposed adjacent to a first sidewall of the case. The second dummy terminal part may extend from the dummy wiring part along a direction opposite to the first direction to be disposed adjacent a second sidewall facing the first sidewall.

According to another aspect of the present invention, a light source module includes a printed circuit board ("PCB") and a plurality of LED packages on which the PCB is mounted. Each of the LED packages includes a light-emitting chip, a case, first and second lead frames and a dummy lead frame. The light-emitting chip generates light. The case includes a bottom portion and a plurality of sidewalls to receive the light-emitting chip. The first and second lead frames are spaced apart from each other and electrically connected to the light-emitting chip. The dummy lead frame is spaced apart from the light-emitting chip and the first and second lead frames, and is electrically isolated from the light-emitting chip and the first and second lead frames. The LED packages are divided into a plurality of driving blocks. LED packages corresponding to a first driving block of the driving blocks are electrically connected to LED packages corresponding to a second driving block through the dummy lead frames of the plurality of LED packages.

In an example embodiment, the dummy lead frame may include a dummy wiring part and a dummy terminal part. The dummy wiring part may be disposed within an inner portion of the case. The dummy terminal part may include a first end disposed within an inner portion of the case and electrically connected to the dummy wiring part and a second end disposed at an external portion of the case and connected to the PCB.

In an example embodiment, the dummy lead frame may further include a dummy pad part disposed on the bottom portion of the case and electrically connected to the dummy wiring part. An open portion exposing the dummy pad part may be formed through the bottom portion of the case.

In an example embodiment, the dummy pad part exposed through the open portion may be electrically connected to the PCB.

According to still another one aspect of the present invention, a backlight assembly includes a light source module, a light guide plate ("LGP") and a receiving container. The light source module includes a PCB, a plurality of LED packages mounted on the PCB, an LGP and a receiving container. Each of the LED packages includes a light-emitting chip, a case, first and second lead frames and a dummy lead frame. The light-emitting chip generates light. The case includes a bottom portion and a plurality of sidewalls, wherein the light-emitting chip is positioned in the case. The first and second lead frames are spaced apart from each other and are electrically connected to the light-emitting chip. The dummy lead frame is spaced apart from the light-emitting chip and the first and second lead frames, and is electrically isolated from the light-emitting chip and the first and second lead frames. The LGP is disposed at a first side surface of the light source module to guide light generated from the light source module. The receiving container includes a bottom plate and sidewalls connected to the bottom plate, wherein the PCB and the LGP are positioned in the receiving container. The LED packages are divided into a plurality of driving blocks, and LED packages corresponding to a first driving block of the driving blocks are electrically connected to LED packages corresponding to a second driving block through the dummy lead frames of the plurality of LED packages.

In an example embodiment, the case may face an incident surface of the LGP. The case may further include an upper portion through which an open portion exposing the light-emitting chip is formed. The bottom portion of the case may face an upper portion of the PCB, and the bottom portion of the PCB faces at least one of sidewalls of the receiving container.

In an example embodiment, the bottom portion of the case may face an upper portion of the PCB, and a bottom portion of the PCB may face a bottom plate of the receiving container.

In an example embodiment, the case may further have an open portion formed through the bottom portion. At least one of the first lead frame, the second lead frame and the dummy lead frame may be exposed toward a rear surface of the case by the open portion.

According to an aspect of the present invention, a light source module comprises a printed circuit board ("PCB"), and a plurality of light-emitting diode ("LED") packages mounted on the PCB, each of the LED packages comprising a lead frame electrically connected to a light-emitting chip, and a dummy lead frame spaced apart from the light-emitting chip and the lead frame, wherein the dummy lead frame is electrically isolated from the light-emitting chip and the lead frame, wherein the LED packages are divided into a plurality of driving blocks, and LED packages corresponding to one driving block are electrically connected to LED packages corresponding to another driving block through dummy lead frames of the plurality of LED packages.

The dummy lead frame may comprise a dummy wiring part disposed in an inner portion of the case, and a dummy terminal part comprising a first end disposed in the inner portion of the case and electrically connected to the dummy wiring part, and a second end disposed at an external portion of the case and connected to the PCB.

Each of the LED packages may further include a case having a bottom portion, and the case includes an open portion formed through the bottom portion, wherein the dummy wiring part further includes a dummy pad part electrically connected to the dummy wiring part and exposed at a rear surface of the case by the open portion.

The lead frame may be exposed at a rear surface of the case by the open portion.

In an LED package, a light source module having the LED package, and a backlight assembly having the light source module, a dummy lead frame is formed and is used as a wiring for connecting to another LED package when the LED package is mounted on a PCB. As a result, the number of signal wiring or a length of a signal wiring formed on the PCB may be decreased. Thus, manufacturing costs of the LED package, a light source module and the backlight assembly may be reduced.

BRIEF DESCRIPTION OF THE DRAWINGS

The above and other features of the present invention will become more apparent by describing in detailed example embodiments thereof with reference to the accompanying drawings, in which.

DETAILED DESCRIPTION OF EMBODIMENTS OF THE INVENTION

The embodiments of the present invention will be explained in more detail with reference to the accompanying drawings.

Figure 1:
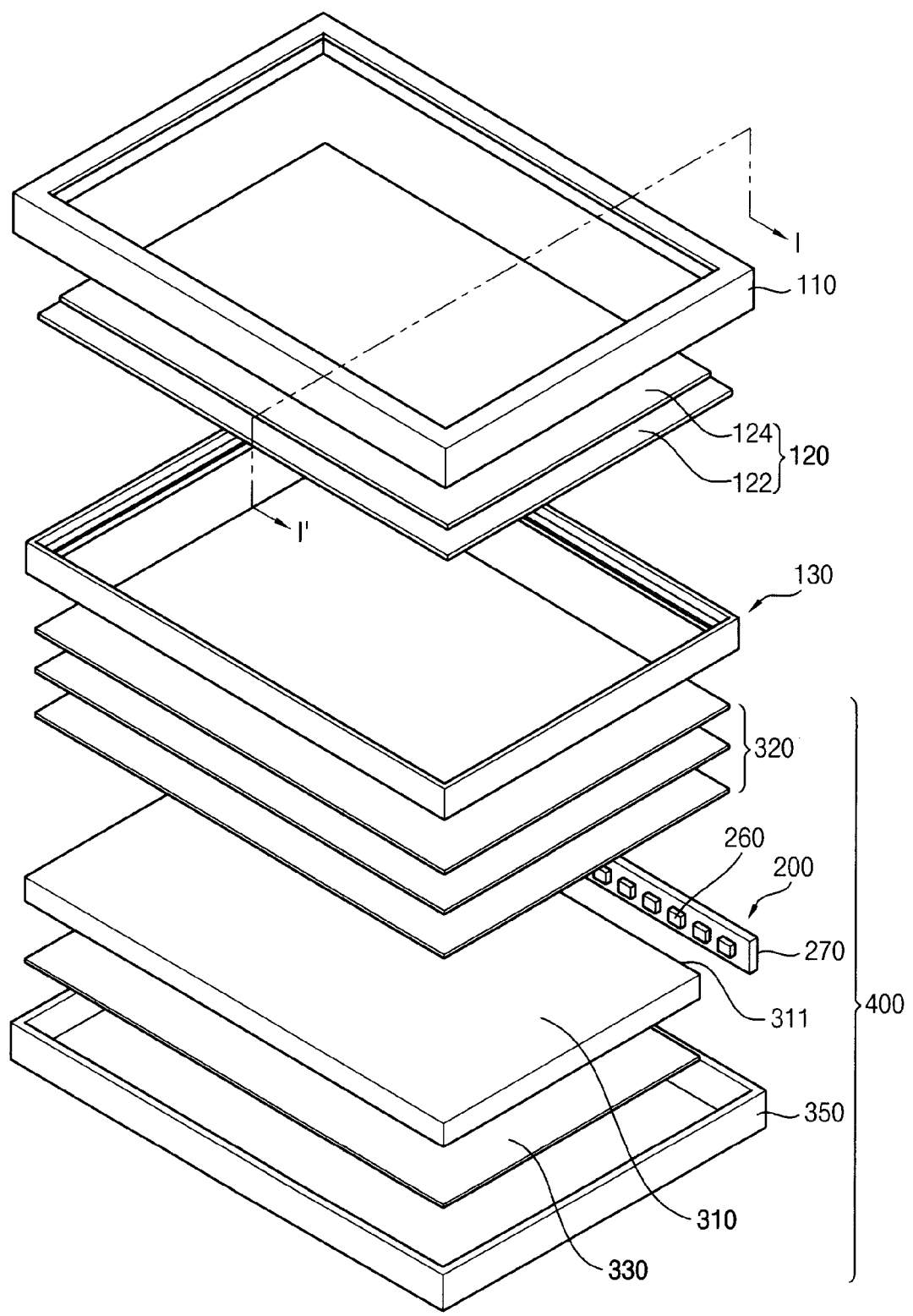
FIG. 1 is an exploded perspective view illustrating a display device according to an exemplary embodiment of the present invention.
Figure 2:
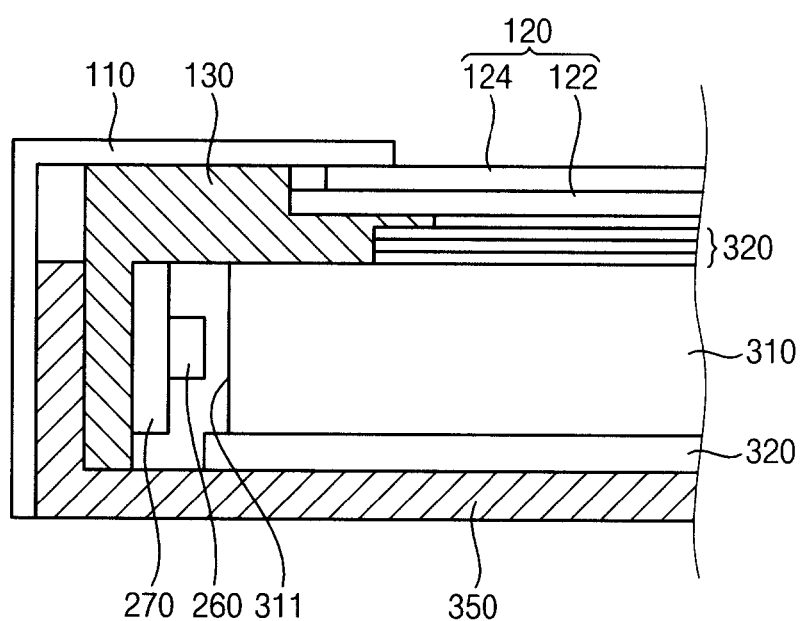
FIG. 2 is a cross-sectional view taken along a line I-I' of FIG. 1.

FIG. 1 is an exploded perspective view illustrating a display device according to an exemplary embodiment of the present invention. FIG. 2 is a cross-sectional view taken along a line I-I' of FIG. 1.

Referring to FIGS. 1 and 2, a display device according to the present exemplary embodiment includes a top chassis 110, a display panel 120 and a backlight assembly 400.

The top chassis 110 is disposed on the display panel 120 and protects the display panel 120 from external impacts. A window is formed through the top chassis 110. The window exposes a display area of the display panel 120.

The display panel 120 includes a first substrate 122, a second substrate 124 facing the first substrate 122, and a liquid crystal layer (not shown) interposed between the first and second substrates 122 and 124.

The backlight assembly 400 is disposed under the display panel 120 to provide the display panel 120 with light.

The backlight assembly 400 includes a light source module 200, a light guide plate ("LGP") 310, a plurality of optical sheets 320, a reflection sheet 330 and a receiving container 350.

The light source module 200 includes a plurality of light-emitting diode ("LED") packages 260 that emit light and a printed circuit board ("PCB") 270 on which the LED packages 260 are mounted. Signal wiring (not shown) for providing the LED packages 260 with a driving voltage is formed on the PCB 270. According to an embodiment, the light source module 200 is formed on at least one side surface of the LGP 310. For example, the light source module 200 may be formed on a first side surface of the LGP 310 along a direction parallel with a long side of the display panel 120. Alternatively, the light source module 200 may be formed on each of two sides of the LGP 310 along a direction parallel with short sides of the display panel 120. A structure of the LED packages 260 will be explained with reference to FIGS. 3 and 4.

The LGP 310 is disposed on a first side of the light source module 200 to guide light emitted from the light source module 200 toward the display panel 120.

The optical sheets 320 are disposed on the LGP 310 and enhance an efficiency of the light incident from the LGP 310. The optical sheets 320 may include a diffusion sheet, a prism sheet and a light-condensing sheet.

The reflection sheet 330 is disposed below the LGP 310 to reflect light leaked from the LGP 310.

The receiving container 350 includes a bottom portion and a plurality of sidewalls extended from edges of the bottom portion to form a receiving space. The receiving container 350 receives the reflection sheet 330, the LGP 310, the light source module 200 and the optical sheets 320. According to an embodiment, the light source module 200 is disposed on a first sidewall of the receiving container 350. Alternatively, the light source module 200 may be disposed on the bottom portion of the receiving container 350.

The backlight assembly 400 may further include a mold frame 130. The mold frame 130 is disposed between the display panel 120 and the optical sheets 320, and supports the display panel 120 with the receiving container 350. In addition, the mold frame 130 fixes the LGP 310, the optical sheets 320 and the reflection sheet 330 in the receiving container 350.

Figure 3:
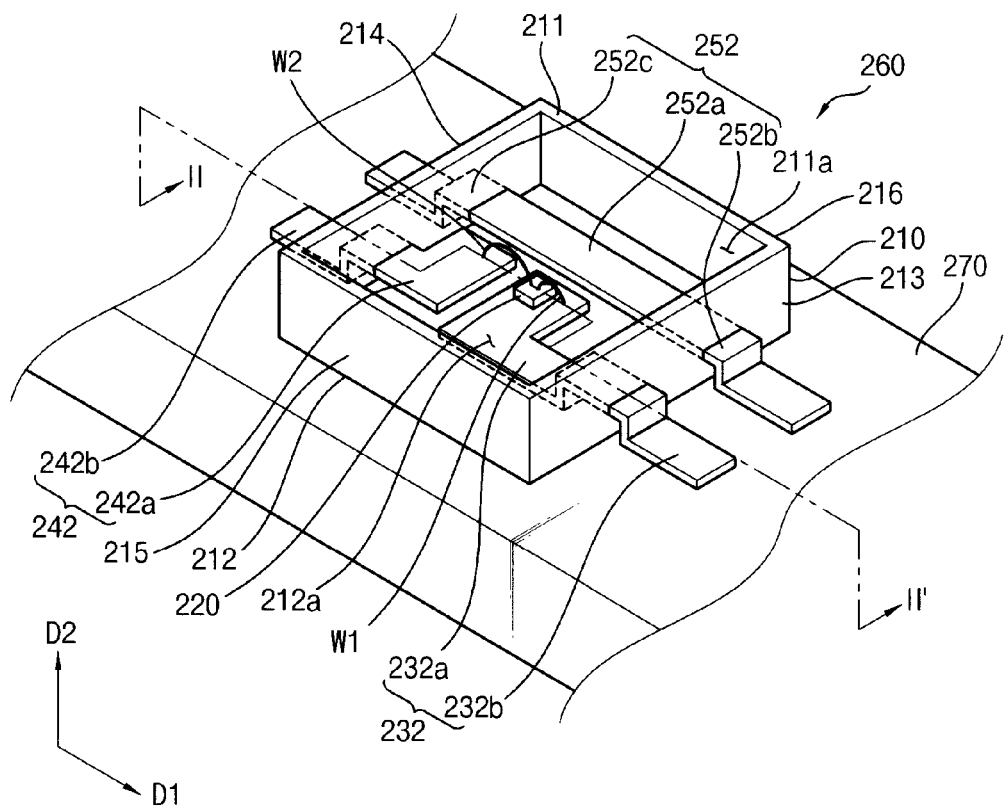
FIG. 3 is a perspective view illustrating a light-emitting diode ("LED") package according to an exemplary embodiment of the present invention.
Figure 4:
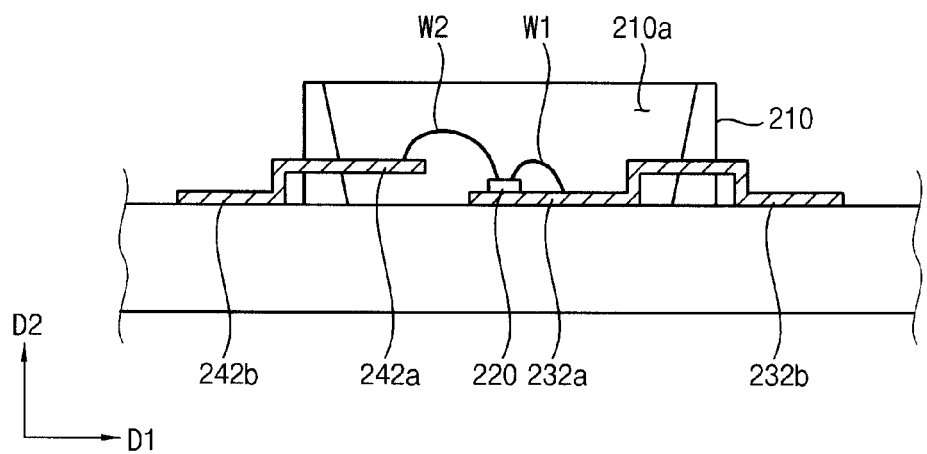
FIG. 4 is a cross-sectional view taken along a line II-II' of FIG. 3.

FIG. 3 is a perspective view illustrating an LED package according to an exemplary embodiment of the present invention. FIG. 4 is a cross-sectional view taken along a line II-II' of FIG. 3.

Referring to FIGS. 1 and 3, the LED package 260, according to the present exemplary embodiment, includes a light-emitting chip 220, a case 210, a first lead frame 232, a second lead frame 242 and a dummy lead frame 252.

The light-emitting chip 220 includes a light-emitting diode chip (hereinafter, an LED chip) generating light by using an electric field light emitting effect. The light-emitting chip 220 may be a diode having, for example, a gallium nitride/aluminum oxide ($GaN/Al_2O_3$) structure.

The LED package 260 may further include a mold part 210a surrounding the light-emitting chip 220. The mold part 210a may include a transparent resin, for example, an epoxy resin, a silicon resin, etc.

The case 210 includes an upper portion 211, a bottom portion 212, a first sidewall 213, a second sidewall 214, a third sidewall 215 and a fourth sidewall 216 to form a receiving space. According to an embodiment, the case 210 comprises an insulation material, which protects and insulates the light-emitting chip 220, the first and second lead frames 232 and 242 and the dummy lead frame 252. For example, the case 210 may comprise a polymer material or a ceramic material. A reflection layer (not shown) for reflecting light generated from the light-emitting chip 220 may be formed on an inner surface of the case 210. An open portion 211a is formed through an inner surface of the case 210, and exposes the light-emitting chip 220, a portion of the first and second lead frames 232 and 242 and a portion of the dummy lead frame 252. The open portion 211a is disposed to face the light incident surface 311 of the LGP 310. The bottom portion 212 of the case 210 is disposed to face a surface of the PCB 270.

The first and second lead frames 232 and 242 are spaced apart from each other. Each first terminal of the first and second lead frames 232 and 242 is electrically connected to the light-emitting chip 220, and each second terminal of the first and second lead frames 232 and 242 is electrically connected to signal wirings of the PCB 270. The first and second lead frames 232 and 242 provide the light-emitting chip 220 with a driving signal transmitted from the signal wirings.

The first lead frame 232 includes a first electrode part 232a and a first terminal part 232b. The first electrode part 232a is disposed in an inner portion of the case 210. According to an embodiment, the first electrode part 232a is electrically connected to the light-emitting chip 220 through a first wire W1. The light-emitting chip 220 may be disposed on the first electrode part 232a. The first electrode part 232a may be exposed at a rear surface of the bottom portion 212 of the case 210 due to an open portion 212a formed through the bottom portion 212 of the case 210. The first electrode part 232a exposed at the rear surface of the bottom portion 212 of the case 210 is connected to the PCB 270 through soldering. The first electrode part 232a may function as a heat radiation pad which radiates heat generated by the light-emitting chip 220 to an external portion of the LED package 260 through the PCB 270. According to an embodiment, the PCB 270 may be a flame retardant composition 4 printed circuit board (FR4 PCB). Alternatively, the PCB 270 may be a metal core printed circuit board (MCPCB).

A first end portion of the first terminal part 232b extends from the first electrode part 232a, and a second end portion of the first terminal part 232b is disposed at an external portion of the case 210. For example, the first terminal part 232b extends from the first electrode part 232a in a first direction D1 to be disposed adjacent to the first sidewall 213. The first terminal part 232b may be electrically and physically connected to a pad (not shown) that is an end portion of a signal wiring formed on the PCB 270 through soldering.

The second lead frame 242 includes a second electrode part 242a and a second terminal part 242b. The second electrode part 242a is spaced apart from the first electrode part 232a, and is disposed in an inner portion of the case 210. According to an embodiment, the second electrode part 242a is electrically connected to the light-emitting chip 220 through a second wire W2. The second electrode part 242a may be spaced apart from the bottom portion 212 of the case 210. A first end portion of the second terminal part 242b extends from the second electrode part 242a, and a second end portion of the second terminal part 242b is exposed at an external portion of the case 210, and is connectable to the PCB 270. For example, the second terminal part 242b extends in an opposite direction from the first direction D1 from the second electrode part 242a to be disposed adjacent to a second sidewall 214, which faces the first sidewall 213. The second terminal part 242b is electrically and physically connected to a pad (not shown) that is an end portion of a signal wiring formed on the PCB 270 through soldering.

The dummy lead frame 252 is spaced apart from the first and second lead frames 232 and 242 and is electrically insulated from the first and second lead frames 232 and 242. According to an embodiment, the dummy lead frame 252 includes a dummy wiring part 252a, a first dummy terminal part 252b and a second dummy terminal part 252c. The dummy wiring part 252a is disposed in an inner portion of the case 210. The dummy wiring part 252a is electrically connected to the first and second dummy terminal parts 252b and 252c, which are disposed at an external portion of the case 210. According to an embodiment, the dummy wiring part 252a is electrically connected to the first and second dummy terminal parts 252b and 252c and is integrally formed with the first and second dummy terminal parts 252b and 252c. The dummy wiring part 252a is electrically insulated from the light-emitting chip 220 and the first and second electrode parts 232a and 242a. According to an embodiment, a first end of the first dummy terminal part 252b extends from the dummy wiring part 252a and is disposed on an inner portion of the case 210, and a second end of the first dummy terminal part 252b penetrates the case 210 and is disposed at an external portion of the case 210. For example, the first dummy terminal part 252b may extend from the dummy wiring part 252a along the first direction D1 to be disposed adjacent to the first sidewall 213. The first dummy terminal part 252b is spaced apart from the first terminal part 232b. The second dummy terminal part 252c extends from the dummy wiring part 252a along an opposite direction from the first direction D1 and is disposed adjacent to the second sidewall 214. The first and second dummy terminal parts 252b and 252c may be opposite to each other. The dummy lead frame 252 may be electrically connected to another LED package formed on the PCB 270. For example, the dummy lead frame 252 may be electrically connected to a dummy lead frame of an adjacent LED package (not shown). According to an embodiment, the dummy lead frame 252 may be electrically connected to an input signal wiring or an output signal wiring of an adjacent LED package.

In this exemplary embodiment, the light-emitting chip 220 is disposed on the first electrode part 232a; however, it is not limited thereto. That is, the light-emitting chip 220 may be disposed on the second electrode part 242a. In the case where the light-emitting chip is disposed on the second electrode part 242a, the second electrode part 242a may be disposed to be exposed through an open portion (e.g., open portion 212a) formed through the bottom portion 212. In addition, in this exemplary embodiment, the dummy lead frame 252 is spaced apart from the bottom portion 212 of the case 210; however, it is not limited thereto. That is, the dummy lead frame 252 may be formed to make contact with the bottom portion 212 of the case 210.

According to the present exemplary embodiment, the LED package 260 includes the dummy lead frame 252, so that the number of signal wirings or a length of a signal wiring formed on the PCB 270 may be decreased. Thus, a manufacturing cost of the light source module may be reduced.

Figure 5A:
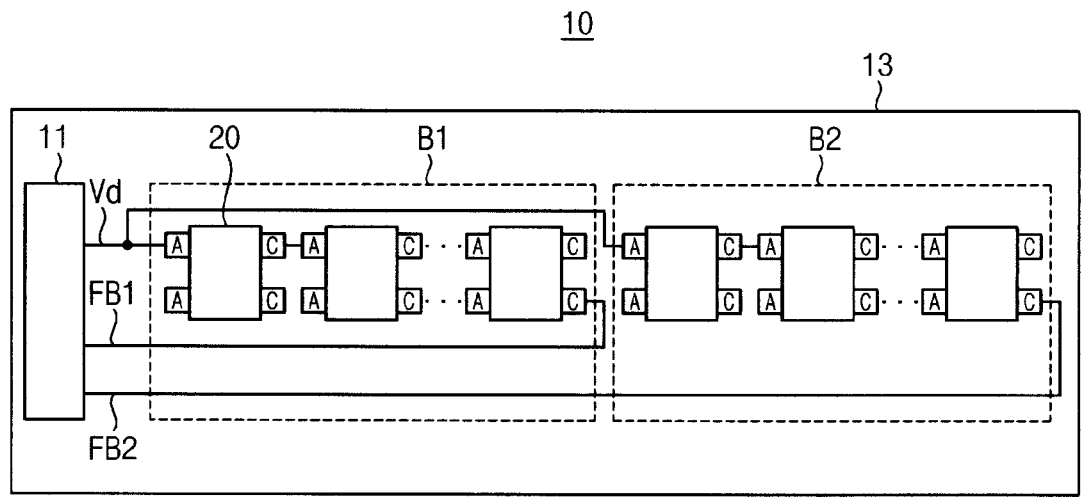
FIG. 5A is a block diagram illustrating a light source module including an LED package of a comparative embodiment.
Figure 5B:
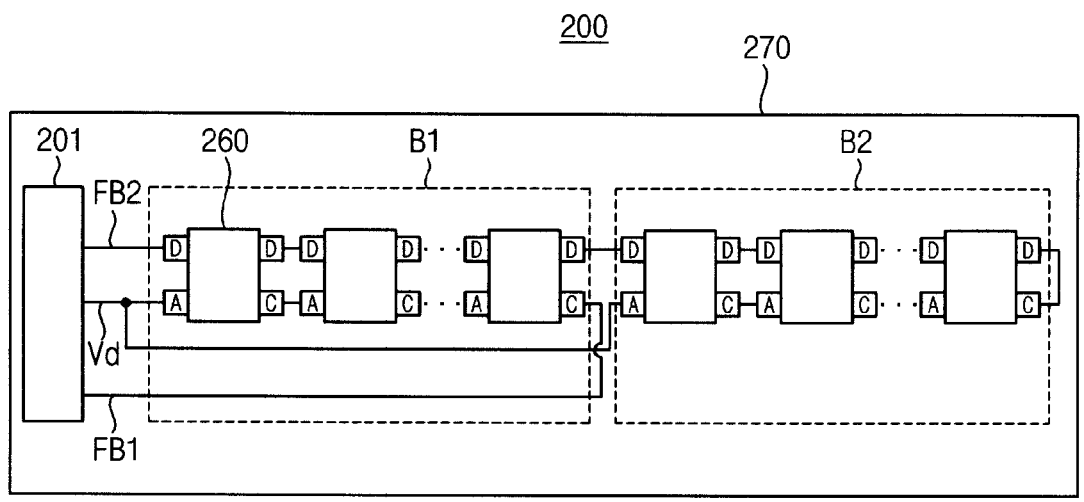
FIG. 5B is a block diagram illustrating a light source module including an LED package according to an exemplary embodiment of the present invention.

FIG. 5A is a block diagram illustrating a light source module including an LED package of a comparative embodiment. FIG. 5B is a block diagram illustrating a light source module including an LED package according to an exemplary embodiment of the present invention.

Referring to FIG. 5A, a light source module 10 includes a plurality of LED packages 20, a PCB 13 on which the LED packages are mounted and a connector 11. The LED packages 20 include a plurality of first lead frames A and a plurality of second lead frames C that are electrically connected to a light-emitting chip (not shown). The LED packages 20 may be divided into a first driving block B1 and a second driving block B2. The LED packages 20 included in each of the first and second driving blocks B1 and B2 are connected to each other. A first signal wiring Vd for delivering a driving voltage to the first and second driving blocks B1 and B2, a second signal wiring FB1 connected to an output terminal of the first driving block B1 to receive a first feedback signal, and a second signal wiring FB2 connected to an output terminal of the second driving block B2 to receive a second feedback signal are formed on the PCB 13. The first and second feedback signals are delivered to a driving circuit (not shown) through the connector 11. The driving circuit drives the light source module 10. The driving circuit controls driving currents supplied to the LED packages 20 based on the first and second feedback signals.

Referring FIG. 5B, a light source module 200 according to an exemplary embodiment of the present invention includes a plurality of LED packages 260, a PCB 270 on which the LED packages 260 are mounted, and a connector 201 electrically connected to signal wirings for driving the LED packages 260. The LED packages 260 include first and second lead frames A and C electrically connected to a light-emitting chip (not shown) and a dummy lead frame D electrically isolated from the first and second lead frames A and C. According to an embodiment, the LED packages 260 are divided into a first driving block B1 and a second driving block B2. The first and second driving blocks B1 and B2 receive a driving voltage through a first signal wiring Vd. A first feedback signal from the first driving block B1 is transmitted to the connector 201 through a second signal wiring FB1, and a second feedback signal from the second driving block B2 is transmitted through a second signal wiring FB2 to the connector 201 through the dummy lead frames D of the first and second driving blocks B1 and B2. For example, a second lead frame C of a last LED package 260 (rightmost in FIG. 5B) is electrically connected to a dummy lead frame D. The LED packages 260 included in the second driving block B2 are electrically connected to each other through their dummy lead frames D. The dummy lead frames D of the LED packages 260 included in the second driving block B2 are electrically connected to the dummy lead frames D of the LED packages 260 included in the first driving block B1. The second feedback signal from the second driving block B2 is transmitted to the connector 201 through the dummy lead frames D of the first and second driving blocks B1 and B2. According to the present exemplary embodiment, the number of signal wirings or a length of a signal wiring formed on the PCB 270 may be decreased as compared to that of, for example, the comparative embodiment. It has been described that the LED packages 20 and 260 are respectively divided into the first and second driving blocks B1 and B2. Alternatively, the LED packages 20 and 260 may be divided into no less than three driving blocks. Moreover, it has been described that the dummy lead frames D are used as a signal wiring for transmitting the second feedback signal. However, it is not limited to that exemplary embodiment. Alternatively, the dummy lead frames D are used as a signal wiring for transmitting the driving voltage of the first feedback signal.

Figure 6:
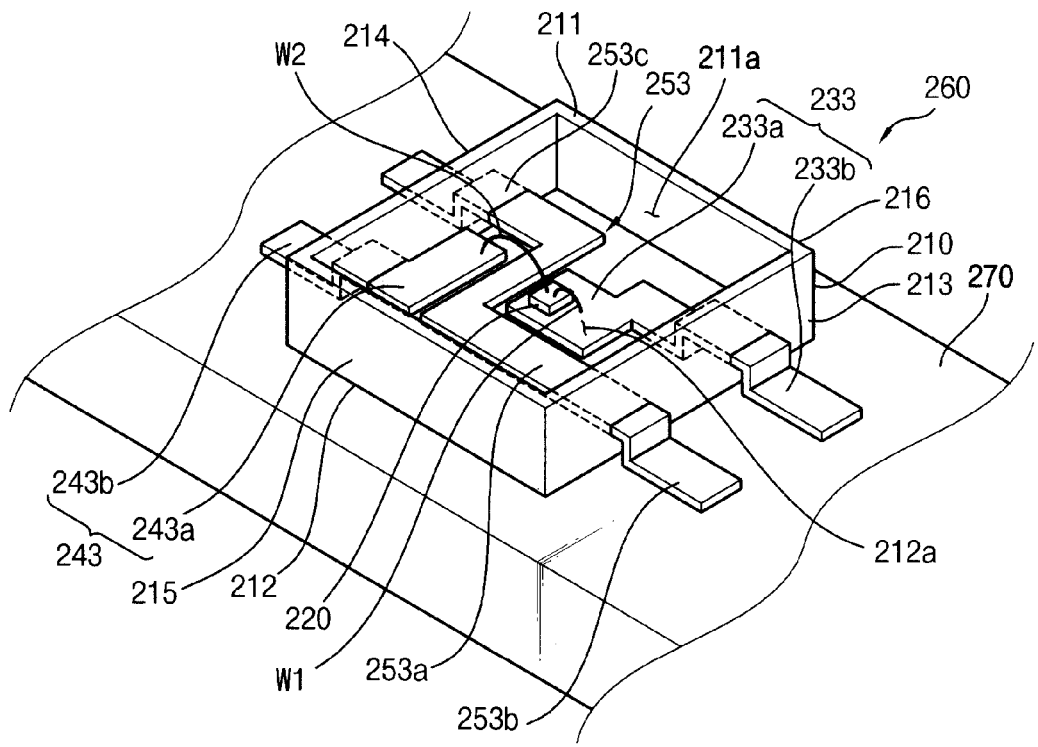
FIG. 6 is a perspective view illustrating an LED package according to an exemplary embodiment of the present invention.

FIG. 6 is a perspective view illustrating an LED package according to another exemplary embodiment of the present invention.

A display device according to the present exemplary embodiment is substantially the same as the display device of FIG. 1, except for an LED package 261, and thus the same reference numerals will be used to refer to the same or like parts as those described in FIG. 1. In addition, the LED package 261 is similar to the LED package 260 of FIGS. 3 and 4, and thus the same reference numerals will be used to refer to the same or like parts as those described in FIGS. 3 and 4 and any repetitive detailed explanation may hereinafter be omitted.

Referring to FIG. 6, the LED package 261 includes a light-emitting chip 220, a case 210, a first lead frame 233, a second lead frame 243 and a dummy lead frame 253.

The first lead frame 233 includes a first electrode part 233*a* and a first terminal part 233*b*. The first electrode part 233*a* is electrically connected to the light-emitting chip 220 through a first wire W1.

The second lead frame 243 includes a second electrode part 243*a* and a second terminal part 243*b*. The second electrode part 243*a* is electrically connected to the light-emitting chip 220 through a second wire W2. The light-emitting chip 220 may be disposed on the first electrode part 233*a*. Alternatively, the light-emitting chip 220 may be disposed on the second electrode part 243*a*.

The dummy lead frame 253 is spaced apart from the first and second lead frames 233 and 243, and is electrically isolated from the first and second lead frames 233 and 243. The dummy lead frame 253 may be electrically connected to another LED package formed on the PCB 270. The dummy lead frame 253 includes a dummy wiring part 253*a*, a first dummy terminal part 253*b* and a second dummy terminal part 253*c*. The dummy wiring part 253*a* is spaced apart from the first and second electrode parts 233*a* and 243*a*, and is positioned within an inner portion of the case 210. The dummy wiring part 253*a* may be formed to have an L-shape. The first dummy terminal part 253*b* may be disposed adjacent to a first sidewall 213 of the case 210, and the second dummy terminal part 253*c* may be disposed adjacent to a second sidewall 214 opposite to the first sidewall 213 of the case 210. The first dummy terminal part 253*b* may be disposed to face the first terminal part 233*b* disposed at a first end portion of the first sidewall 213, and the second dummy terminal part 253*c* may be disposed to face the second terminal part 243*b* disposed at a first end portion of the second sidewall 214.

Figure 7:
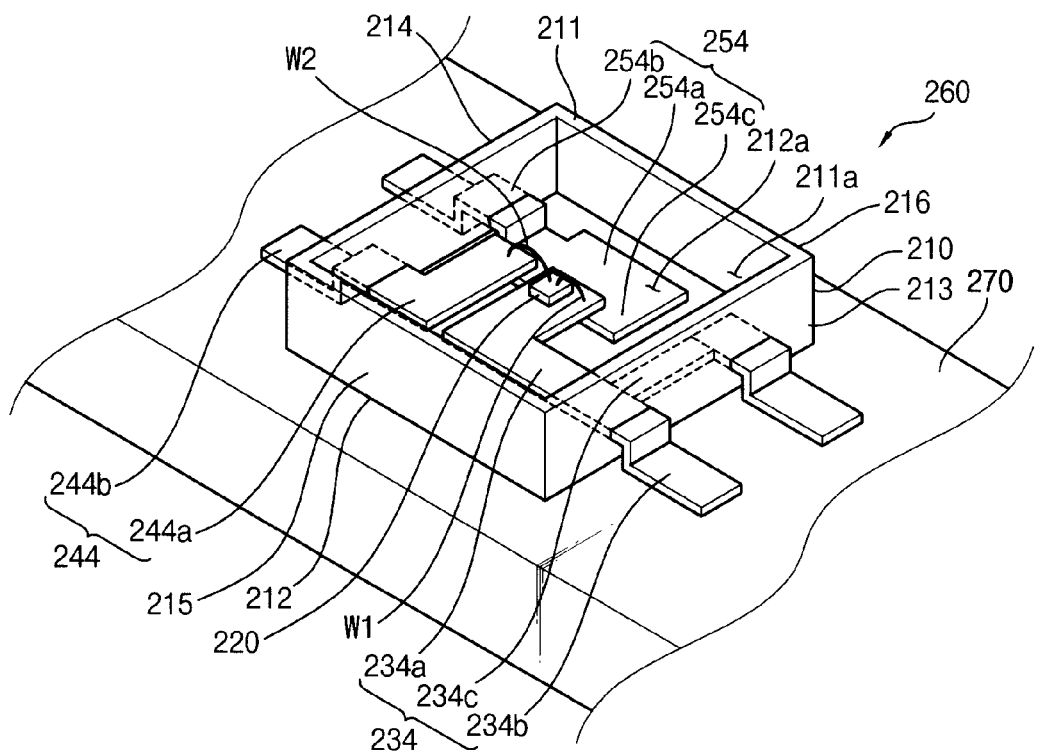
FIG. 7 is a perspective view illustrating an LED package according to an exemplary embodiment of the present invention.

FIG. 7 is a perspective view illustrating an LED package according to another exemplary embodiment of the present invention.

A display device according to the present exemplary embodiment is substantially the same as the display device of FIG. 1 except for an LED package 262, and thus the same reference numerals will be used to refer to the same or like parts as those described in FIG. 1. Moreover, the LED package 262 is similar to the LED package 260 of FIGS. 3 and 4, and thus the same reference numerals will be used to refer to the same or like parts as those described in FIGS. 3 and 4 and any repetitive detailed explanation may hereinafter be omitted.

Referring to FIG. 7, the LED package 262 includes a light-emitting chip 220, a case 210, a first lead frame 234, a second lead frame 244 and a dummy lead frame 254.

The first lead frame 234 includes a first electrode part 234*a*, a plurality of first terminal parts 234*b* and a connection part 234*c*. The first electrode part 234*a* is electrically connected to the light-emitting chip 220 through a first wire W1. The first electrode part 234*a* is spaced apart from the bottom portion 212, and is positioned within an inner portion of the case 210. The first terminal parts 234*b* are spaced apart from a first sidewall 213 of the case 210. First end portions of the first terminal parts 234*b* extend from the first electrode part 234*a*, and second end portions of the first terminal parts 234*b* penetrate through the case 210 to be disposed at an external portion of the case 210. The first terminal parts 234*b* are electrically connected to each other through the connection part 234*c*. The first terminal parts 234*b* may be connected to the PCB 270 through soldering.

The second lead frame 244 includes a second electrode part 244*a* and a second terminal part 244*b*. The second electrode part 244*a* is spaced apart from the first electrode part 234*a* and is positioned within an inner portion of the case 210. The second electrode part 244*a* is electrically connected to the light-emitting chip 220 through a second wire W2. The second electrode part 244*a* is spaced apart from the bottom portion 212 of the case 210. A first end portion of the second terminal part 244*b* extends from the second electrode part 244*a*, and a second end portion of the second terminal part 244*b* penetrates through the case 210 to be disposed at an external portion of the case 210. The second terminal part 244*b* is disposed adjacent to a second sidewall 214 opposite to the first sidewall 213 of the case 210. The second terminal part 244*b* may be connected to the PCB 270 through soldering.

The dummy lead frame 254 is spaced apart from the first and second lead frames 234 and 244 and is electrically isolated from the first and second lead frames 234 and 244. The dummy lead frame 254 may be electrically connected to another LED package (not shown) formed on the PCB 270. The dummy lead frame 254 may include a dummy wiring part 254*a*, a dummy terminal part 254*b* and a dummy pad part 254*c*. The dummy wiring part 254*a* is spaced apart from the first and second electrode parts 234*a* and 244*a* and is positioned within an inner portion of the case 210. A first end portion of the dummy terminal part 254*b* extends from a first end portion of the dummy wiring part 254*a*, and a second end portion of the dummy terminal part 254*b* penetrates the case 210 to be disposed at an external portion of the case 210. For example, the dummy terminal part 254*b* is spaced apart from the second terminal part 244*b* and is adjacent the second sidewall 214. The dummy pad part 254*c* is disposed within an inner portion of the case 210 and extends from a second end portion of the dummy wiring part 254*a* opposite to the first end of the dummy wiring part 254*a*. According to an embodiment, the dummy pad part 254*c* is exposed toward a rear surface of the bottom portion 212 by an open portion 212*a* formed through the bottom portion 212 of the case 210. The dummy pad part 254*c* exposed toward a rear surface of the bottom portion 212 of the case 210 is connected to the PCB 270. The dummy wiring part 254*a* and dummy pad part 254*c* may function as a heat radiation pad which radiates heat generated at the light-emitting chip 220 to an external portion of LED package 262 through the PCB 270.

Figure 8:
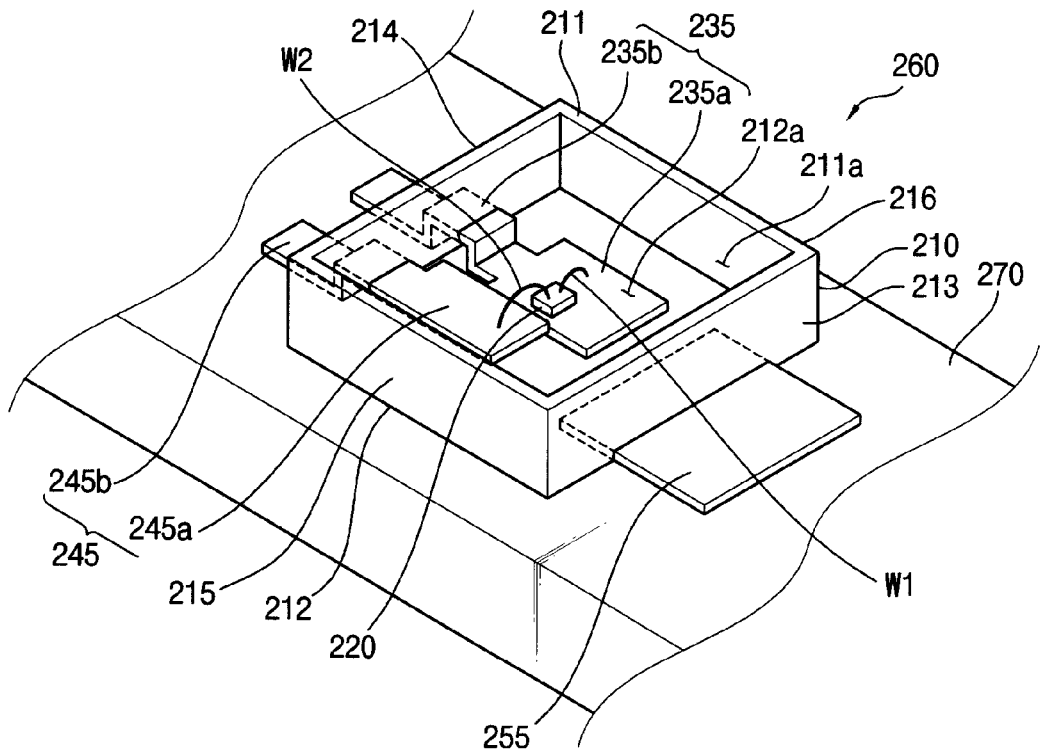
FIG. 8 is a perspective view illustrating an LED package according to an exemplary embodiment of the present invention.

FIG. 8 is a perspective view illustrating an LED package according to another exemplary embodiment of the present invention.

A display device according to the present exemplary embodiment is substantially the same as the display device of FIG. 1 except for an LED package 263, and thus the same reference numerals will be used to refer to the same or like parts as those described in FIG. 1. Moreover, the LED package 263 is similar to the LED package 260 of FIGS. 3 and 4, and thus the same reference numerals will be used to refer to the same or like parts as those described in FIGS. 3 and 4 and any repetitive detailed explanation may hereinafter be omitted.

Referring to FIG. 8, the LED package 263 includes a light-emitting chip 220, a case 210, a first lead frame 235, a second lead frame 245 and a dummy lead frame 255.

The first lead frame 235 includes a first electrode part 235a and a first terminal part 235b. The first electrode part 235a is electrically connected to the light-emitting chip 220 through a first wire W1. The first electrode part 235a is disposed in an inner portion of the case 210. According to an embodiment, the light-emitting chip 220 is disposed on the first electrode part 235a. According to an embodiment, the first electrode part 235a is exposed toward a rear surface of the bottom portion 212 of the case 210 by an open portion 212a formed through the bottom portion 212 of the case 210. The first electrode part 235a exposed toward the rear surface of the bottom portion 212 of the case 210 is connected to the PCB 270 through soldering. The first electrode part 235a may function as a heat radiation pad which radiates heat generated at the light-emitting chip 220 to an external portion of the LED package 263 through the PCB 270. A first end portion of the first terminal part 235b is extends from the first electrode part 235a, and a second end portion of the first terminal part 235b penetrates through the case 210 to be disposed at an external portion of the case 210. For example, the first terminal part 235b may be disposed adjacent to a second sidewall 214 of the case 210. The first terminal part 235b is electrically and physically connected to the PCB 270.

The second lead frame 245 includes a second electrode part 245a and a second terminal part 245b. The second electrode part 245a is spaced apart from the first electrode part 235a. The second electrode part 245a is electrically connected to the light-emitting chip 220 through a second wire W2. A first end portion of the second terminal part 245b extends from the second electrode part 245a, and a second end portion of the second terminal part 245b penetrates through the case 210 to be disposed at an external portion of the case 210. The second terminal part 245b is disposed at the second sidewall 214 of the case 210 and is spaced apart from the first terminal part 235b. The second terminal part 245b is connected to the PCB 270 through soldering.

The dummy lead frame 255 is spaced apart from the first and second lead frames 235 and 245 and is electrically isolated from the first and second lead frames 235 and 245. The dummy lead frame 255 is disposed adjacent to the first sidewall 213 opposite to the second sidewall 214 on which the first and second terminal parts 235b and 245b are disposed. According to an embodiment, the dummy lead frame 255 is disposed on the bottom portion 212 of the case 210 adjacent to the first sidewall 213. The dummy lead frame 255 extends from the sidewall 213 along a first direction D1. A portion of the dummy lead frame 255 may be disposed in an inner portion of the case 210, and a remaining portion of the dummy lead frame 255 penetrate through the case 210 to be disposed at an external portion of the case 210. According to an embodiment, the dummy lead frame 255 is exposed toward a rear surface through an open portion (not shown) formed through the bottom portion 212 of the case 210. The dummy lead frame 255 may be electrically connected to the PCB 270 through soldering. The dummy lead frame 255 may be electrically connected to another LED package (not shown) formed on the PCB 270.

Figure 9:
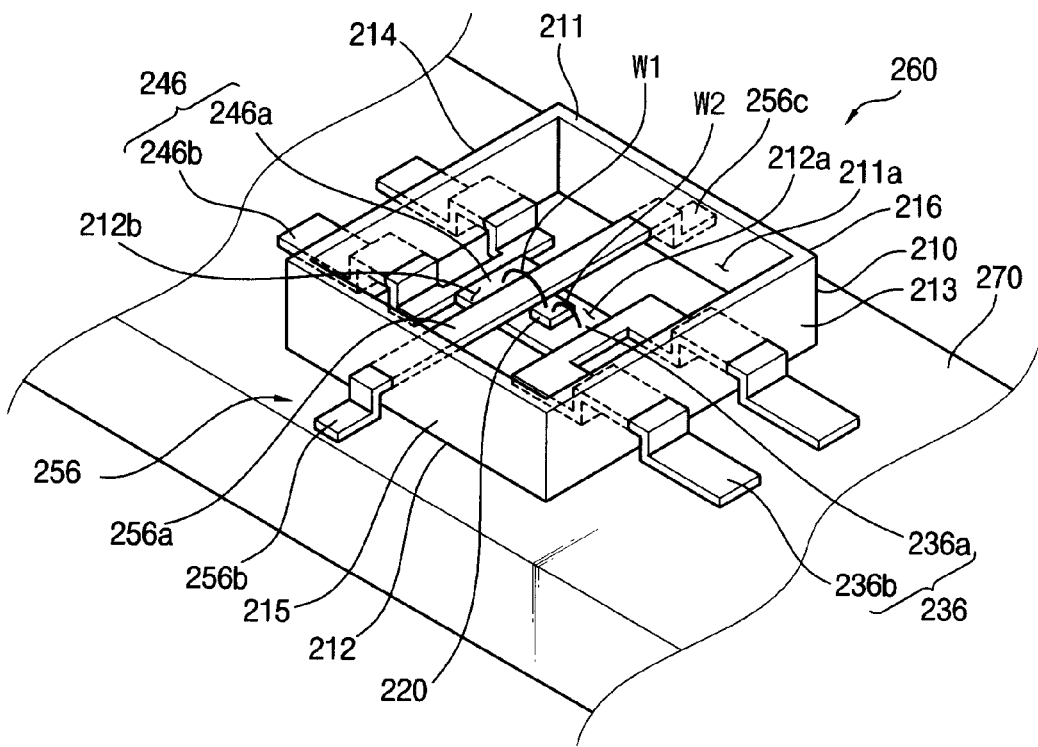
FIG. 9 is a perspective view illustrating an LED package according to an exemplary embodiment of the present invention.

FIG. 9 is a perspective view illustrating an LED package according to another exemplary embodiment of the present invention.

A display device according to the present exemplary embodiment is substantially the same as the display device of FIG. 1 except an LED package 264, and thus the same reference numerals will be used to refer to the same or like parts as those described in FIG. 1. Moreover, the LED package 264 is similar to the LED package 260 of FIGS. 3 and 4, and thus the same reference numerals will be used to refer to the same or like parts as those described in FIGS. 3 and 4 and any repetitive detailed explanation may hereinafter be omitted.

Referring to FIG. 9, the LED package 264 includes a light-emitting chip 220, a case 210, a first lead frame 236, a second lead frame 246 and dummy lead frame 256.

The first lead frame 236 includes a first electrode part 236a and a plurality of first terminal parts 236b. The first electrode part 236a is electrically connected to the light-emitting chip 220 through a first wire W1. According to an embodiment, the first electrode part 236a is exposed toward a rear surface of the bottom portion 212 due to an open portion 212a formed through the bottom portion 212 of the case 210. The first electrode part 236a exposed toward the rear surface of the bottom portion 212 of the case 210 is connected to the PCB 210 through soldering. The first electrode part 236a functions as a heat radiation pad which radiates heat generated at the light-emitting chip 220 to an external portion of the LED package 264 through the PCB 270.

The first terminal parts 236b extend from the first electrode part 236a, penetrate through a sidewall 213, and are disposed at an external portion of the case 210. For example, the first terminal parts 236b are extended from the first electrode part 236a in a direction toward a first sidewall 213 of the case 210, and penetrate through the sidewall 213, so that ends of the first terminal parts 236b are spaced apart from the first sidewall 213 on the outside of the case 210. The first terminal parts 236b may be electrically and physically connected to the PCB 270 through soldering.

The second lead frame 246 includes a second electrode part 246a and a plurality of second terminal parts 246b. The second electrode part 246a is spaced apart from the first electrode part 236a, and is positioned within an inner portion of the case 210. The second electrode part 246a is electrically connected to the light-emitting chip 220 through a second wire W2. According to an embodiment, the second electrode part 246a is disposed on the bottom portion 212 of the case. The second electrode part 246a may be exposed toward a rear surface of the bottom portion 212 by a second open portion 212b formed through a bottom portion 212 of the case 210. The second electrode part 246a exposed toward the rear surface of the bottom portion 212 of the case 210 may be connected to the PCB 270 through soldering. The second electrode part 246a may function as a heat radiation pad which radiates heat generated at the light-emitting chip 220 to an external portion of the LED package 264 through the PCB 270.

First ends of the second terminal parts 246b extend from the second electrode part 246a, and second ends of the second terminal parts 246b penetrate through the case 210 to be disposed at an external portion of the case 210. For example, the second terminal parts 246b extend from the second electrode part 246a toward the second sidewall 214 opposite to the first sidewall 213, and the second ends of the second terminal parts 246b are spaced apart from the second sidewall 214 on the outside of the case 210. The second terminal parts 246b are electrically and physically connected to the PCB 270 through soldering.

The dummy lead frame 256 is spaced apart from the first and second lead frames 236 and 246 and is electrically isolated from the first and second lead frames 236 and 246. The dummy lead frame 256 includes a dummy wiring part 256a, a first dummy terminal part 256b and a second dummy terminal part 256c. The dummy wiring part 256a may is disposed in an inner portion of the case 210 and extends in parallel with a length direction of the first and second sidewalls 213 and 214. First end portions of the first and second dummy terminal parts 256b and 256c extend from the dummy wiring part 256a, and second end portions of the first and second dummy terminal parts 256b and 256c penetrate through the case 210 to be disposed at an external portion of the case 210. For example, according to an embodiment, the first dummy terminal part 256b is disposed adjacent to a third sidewall 215, which is substantially perpendicular to the first sidewall 213 of the case 210. The second dummy terminal part 256c is disposed adjacent to a fourth sidewall 216 opposite to the third sidewall 215. The first and second dummy terminal parts 256b and 256c are connected to the PCB 270 through soldering.

As described above, according to exemplary embodiments of the present invention, a dummy lead frame is formed on an LED package and the dummy lead frame is used as a wiring for connecting to another LED package when the LED package is mounted on a PCB, so that the number of signal wirings or a length of a signal wiring formed on the PCB may be decreased. Thus, a manufacturing cost of the light source module may be reduced.

Moreover, an open portion is formed through a bottom portion of a case, so that at least one of the first and second electrode parts is exposed toward a rear surface of the bottom portion by the open portion. As a result, heat generated from a light-emitting chip may effectively radiate without an additional heat radiation pad.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings of the present invention. Accordingly, all such modifications are intended to be included within the scope of the present invention as defined in the claims.

What is claimed is:

1. A light source module comprising:
a printed circuit board ("PCB"); and
a plurality of light-emitting diode ("LED") packages mounted on the PCB, each of the LED packages comprising:
a light-emitting chip;
a case including a bottom portion and a plurality of sidewalls, wherein the light-emitting chip is positioned in the case;
first and second lead frames spaced apart from each other, and electrically connected to the light-emitting chip; and
a dummy lead frame spaced apart from the light-emitting chip and the first and second lead frames, wherein the dummy lead frame is electrically isolated from the light-emitting chip and the first and second lead frames,
wherein the LED packages are divided into a plurality of driving blocks, and LED packages corresponding to a first driving block of the driving blocks are electrically connected to LED packages corresponding to a second driving block through dummy lead frames of the plurality of LED packages.

2. The light source module of claim 1, wherein the dummy lead frame comprises:
a dummy wiring part disposed in an inner portion of the case; and
a dummy terminal part comprising a first end disposed in the inner portion of the case and electrically connected to the dummy wiring part, and a second end disposed at an external portion of the case and connected to the PCB.

3. The light source module of claim 2, wherein the dummy lead frame further comprises a dummy pad part disposed on the bottom portion of the case, and electrically connected to the dummy wiring part, and
the dummy pad part is exposed to an outside of the case through an open portion formed through the bottom portion of the case.

4. The light source module of claim 3, wherein the dummy pad part exposed through the open portion is electrically connected to the PCB.

5. A backlight assembly comprising:
a light source module comprising:
a printed circuit board ("PCB"); and
a plurality of light-emitting diode ("LED") packages mounted on the PCB, each of the LED packages comprising:
a light-emitting chip;
a case including a bottom portion and a plurality of sidewalls, wherein the light-emitting chip is positioned in the case;
first and second lead frames spaced apart from each other, and electrically connected to the light-emitting chip; and
a dummy lead frame spaced apart from the light-emitting chip and the first and second lead frames, wherein the dummy lead frame is electrically isolated from the light-emitting chip and the first and second lead frames,
a light guide plate disposed at a first side surface of the light source module; and
a receiving container comprising a bottom plate and sidewalls connected to the bottom plate, wherein the PCB and the light guide plate are positioned in the receiving container,
wherein the LED packages are divided into a plurality of driving blocks, and LED packages corresponding to a first driving block of the driving blocks are electrically connected to LED packages corresponding to a second driving block through dummy lead frames of the plurality of LED packages.

6. The backlight assembly of claim 5, wherein:
the case faces an incident surface of the light guide plate,
the case further comprises an upper portion through which an open portion exposing the light-emitting chip is formed,
the bottom portion of the case faces an upper portion of the PCB, and a bottom portion of the PCB faces at least one of the sidewalls of the receiving container.

7. The backlight assembly of claim 5, wherein the bottom portion of the case faces an upper portion of the PCB, and a bottom portion of the PCB faces a bottom plate of the receiving container.

8. The backlight assembly of claim 5, wherein the case further comprises an open portion formed through the bottom portion, wherein at least one of the first lead frame, the second lead frame and the dummy lead frame is exposed toward a rear surface of the case by the open portion.

9. The backlight assembly of claim 5, wherein the dummy lead frame comprises:
   a dummy wiring part disposed in an inner portion of the case; and
   a dummy terminal part comprising a first end disposed in an inner portion of the case, and electrically connected to the dummy wiring part, and a second end disposed at an external portion of the case and connected to the PCB.

10. The backlight assembly of claim 9, wherein the dummy lead frame further comprises a dummy pad part disposed on the bottom portion of the case and electrically connected to the dummy wiring part, and
    the case includes an open portion formed through the bottom portion of the case, wherein the dummy pad part is exposed at a rear surface of the case by the open portion.

11. The backlight assembly of claim 10, wherein the dummy pad part exposed through the open portion is electrically connected to the PCB.

12. A light source module comprising:
    a printed circuit board ("PCB"); and
    a plurality of light-emitting diode ("LED") packages mounted on the PCB, each of the LED packages comprising:
    a lead frame electrically connected to a light-emitting chip; and
    a dummy lead frame spaced apart from the light-emitting chip and the lead frame, wherein the dummy lead frame is electrically isolated from the light-emitting chip and the lead frame,
    wherein the LED packages are divided into a plurality of driving blocks, and LED packages corresponding to one driving block are electrically connected to LED packages corresponding to another driving block through dummy lead frames of the plurality of LED packages.

13. The light source module of claim 12, wherein the dummy lead frame comprises:
    a dummy wiring part disposed in an inner portion of the case; and
    a dummy terminal part comprising a first end disposed in the inner portion of the case and electrically connected to the dummy wiring part, and a second end disposed at an external portion of the case and connected to the PCB.

14. The light source module of claim 13, wherein each of the LED packages further includes a case having a bottom portion, and the case includes an open portion formed through the bottom portion, wherein the dummy wiring part further includes a dummy pad part electrically connected to the dummy wiring part and exposed at a rear surface of the case by the open portion.

15. The light source module of claim 12, wherein each of the LED packages further includes a case having a bottom portion, and the case includes an open portion formed through the bottom portion, wherein the lead frame is exposed at a rear surface of the case by the open portion.

* * * * *